(12) United States Patent
Fang et al.

(10) Patent No.: US 11,762,249 B1
(45) Date of Patent: Sep. 19, 2023

(54) DISPLAY PANEL

(71) Applicant: Guangzhou China Star Optoelectronics Semiconductor Display Technology Co., LTD., Guangdong (CN)

(72) Inventors: Jianwei Fang, Guangdong (CN); Ning Zhang, Guangdong (CN)

(73) Assignee: Guangzhou China Star Optoelectronics Semiconductor Display Technology Co., LTD., Guangzhou (CN)

( * ) Notice: Subject to any disclaimer, the term of this patent is extended or adjusted under 35 U.S.C. 154(b) by 0 days.

(21) Appl. No.: 18/088,851

(22) Filed: Dec. 27, 2022

(30) Foreign Application Priority Data

Nov. 15, 2022 (CN) .......................... 202211429260.1

(51) Int. Cl.
*G02F 1/1343* (2006.01)
*G02F 1/1333* (2006.01)
*G02F 1/1362* (2006.01)
*G02F 1/1368* (2006.01)
*H01L 27/12* (2006.01)

(52) U.S. Cl.
CPC .. *G02F 1/136227* (2013.01); *G02F 1/133345* (2013.01); *G02F 1/134309* (2013.01); *G02F 1/134372* (2021.01); *H01L 27/1248* (2013.01); *G02F 1/1368* (2013.01); *G02F 1/134318* (2021.01); *G02F 1/136286* (2013.01)

(58) Field of Classification Search
CPC ............. G02F 1/1333; G02F 1/133345; G02F 1/133357; G02F 1/1343; G02F 1/134309; G02F 1/134318; G02F 1/134372; G02F 1/1362; G02F 1/136227; G02F 1/136286; G02F 1/1368; H01L 27/1248
See application file for complete search history.

(56) References Cited

U.S. PATENT DOCUMENTS

2002/0101557 A1* 8/2002 Ono .................. G02F 1/134363
349/193
2003/0090599 A1* 5/2003 Ochiai .............. G02F 1/136213
349/39

* cited by examiner

*Primary Examiner* — Thoi V Duong

(57) ABSTRACT

A display panel is provided, including an opposing substrate, a liquid crystal layer, and an array substrate, and the liquid crystal layer is disposed between the opposing substrate and the array substrate. The array substrate includes a substrate, a first metal layer, a first insulating layer, a second metal layer, a second insulating layer, a passivation layer, and a third metal layer. The second metal layer includes a first electrode, and the first electrode is one of a pixel electrode and a common electrode. The third metal layer includes a second electrode, and the second electrode is the other one of the pixel electrode and the common electrode. By disposing the first electrode and the second electrode between the first insulating layer and the second insulating layer, a sum of thicknesses of the first insulating layer and the second insulating layer can remain a first predetermined thickness.

8 Claims, 3 Drawing Sheets

DISPLAY PANEL

RELATED APPLICATION

This application claims the benefit of priority of Chinese Patent Application No. 202211429260.1 filed on Nov. 15, 2022, the contents of which are incorporated herein by reference in their entirety.

FIELD OF INVENTION

The invention relates to the field of display technology, and particularly to a display panel.

BACKGROUND

At present, in a display panel such as a fringe field switching (FFS) structure, a pixel driving voltage actually generated by the display panel needs to be greater than a minimum pixel driving voltage required by the display panel to drive a pixel electrode to generate sufficient electric field force, and the minimum pixel driving voltage required by the display panel is related to a thickness of the film layer between the pixel electrode and a common electrode arranged in different layers. However, the thickness of each film layer in the traditional display panel is limited by the process yield and reliability, and it is impossible to accurately adjust the minimum pixel driving voltage required by the display panel. Therefore, the traditional display panel cannot meet precise adjustment requirements for the actual pixel driving voltage and power consumption.

SUMMARY

Embodiments of the present invention provide a display panel to solve the technical problem that the pixel driving voltage cannot be precisely adjusted.

An embodiment of the present application provides a display panel, the display panel includes an opposing substrate, a liquid crystal layer, and an array substrate, and the liquid crystal layer is disposed between the opposing substrate and the array substrate.

The array substrate comprises:
a substrate;
a first metal layer disposed on the substrate;
a first insulating layer disposed on the substrate and the first metal layer;
a second metal layer disposed on the first insulating layer, the second metal layer comprises a first electrode, and the first electrode is one of a pixel electrode and a common electrode;
a second insulating layer disposed on the second metal layer and the first insulating layer;
a passivation layer disposed on the second insulating layer; and
a third metal layer disposed on the passivation layer, the third metal layer comprises a second electrode, and the second electrode is the other one of the pixel electrode and the common electrode.

A sum of a thickness of the first insulating layer and a thickness of the second insulating layer is a first predetermined thickness.

In the display panel of an embodiment of the present application, the first metal layer comprises a gate and a common signal trace;
the third metal layer further comprises a bridging component; and
the array substrate further comprises:
a source;
a drain;
a first via hole, wherein the first via hole penetrates the passivation layer, the second insulating layer and the first insulating layer;
a second via hole, wherein the second via hole penetrates the passivation layer; and
a third via hole, wherein the third via hole penetrates the passivation layer and the second insulating layer.

In the display panel of an embodiment of the present application, the first electrode is the pixel electrode, and the second electrode is the common electrode; and
the common electrode is connected to the common signal line through the first via hole, one end of the bridge component is connected to the drain through the second via hole, and the other end of the bridge component is connected to the pixel electrode through the third via hole.

In the display panel of an embodiment of the present application, the first electrode is a common electrode, and the second electrode is a pixel electrode; and
the pixel electrode is connected to the drain through the second via hole, one end of the bridging component is connected to the common signal trace through the first via hole, and the other end of the bridging component is connected to the common electrode through the third via hole.

In the display panel of an embodiment of the present application, a ratio of the thickness of the first insulating layer to the thickness of the second insulating layer is in the range of 0.1 to 10.

Another display panel is provided, comprising an opposing substrate, a liquid crystal layer, and an array substrate, wherein the liquid crystal layer is disposed between the opposing substrate and the array substrate; and
the array substrate comprises:
a substrate;
a first metal layer disposed on the substrate;
an insulating layer disposed on the substrate and the first metal layer;
a first passivation layer disposed on the insulating layer;
a second metal layer disposed on the first passivation layer, the second metal layer comprises a first electrode, and the first electrode is one of a pixel electrode and a common electrode;
a second passivation layer disposed on the first passivation layer and the second metal layer;
a third metal layer disposed on the second passivation layer, wherein the third metal layer comprises a second electrode, and the second electrode is the other one of the pixel electrode and the common electrode.

A sum of a thickness of the first passivation layer and a thickness of the second passivation layer is a second predetermined thickness.

In the display panel of an embodiment of the present application, the first metal layer comprises gates and common signal traces;
the third metal layer further comprises a bridging component; and
the array substrate further comprises:
a source;
a drain;
a fourth via hole, wherein the fourth via hole penetrates the second passivation layer, the first passivation layer, and the insulating layer;
a fifth via hole, wherein the fifth via hole penetrates the second passivation layer and the first passivation layer; and a six via hole, wherein the six via hole penetrates the second passivation layer.

In the display panel of an embodiment of the present application, the first electrode is a pixel electrode, and the second electrode is a common electrode; and the common electrode is connected to the common signal trace through the fourth via hole, one end of the bridge component is connected to the drain through the fifth via hole, and the other end of the bridge component is connected to the pixel electrode through the sixth via hole.

In the display panel of an embodiment of the present application, the first electrode is a common electrode, and the second electrode is a pixel electrode; and the pixel electrode is connected to the drain through the fifth via hole, one end of the bridge component is connected to the common signal trace through the fourth via hole, and the other end of the bridge component is connected to the common signal line through the sixth via hole.

In the display panel of an embodiment of the present application, a ratio of a thickness of the first passivation layer to a thickness of the second passivation layer is in the range of 0.1 to 10.

In the display panel of an embodiment of the present application, a dielectric constant of the second passivation layer is greater than 1.8.

Beneficial effects of the embodiment of the present application are that by disposing the first electrode and the second electrode of the display panel between the first insulating layer and the second insulating layer, and making a sum of the thickness of the first insulating layer and the thickness of the second insulating layer is maintained at a first predetermined thickness, which is convenient for adjusting the thickness of the second insulating layer to adjust the distance between the first electrode and the second electrodes. On the basis of not affecting an overall thickness and reliability of the first insulating layer and the second insulating layer, the minimum pixel driving voltage required by the display panel can be realized, and precise adjustment requirements of the pixel driving voltage and power consumption actually generated by the display panel can be realized.

BRIEF DESCRIPTION OF DRAWINGS

To detailly explain the technical schemes of the embodiments or existing techniques, drawings that are used to illustrate the embodiments or existing techniques are provided. Apparently, the illustrated embodiments are just a part of those of the present disclosure. It is easy for any person having ordinary skill in the art to obtain other drawings without labor for inventiveness.

DETAILED DESCRIPTION

Figure 1:
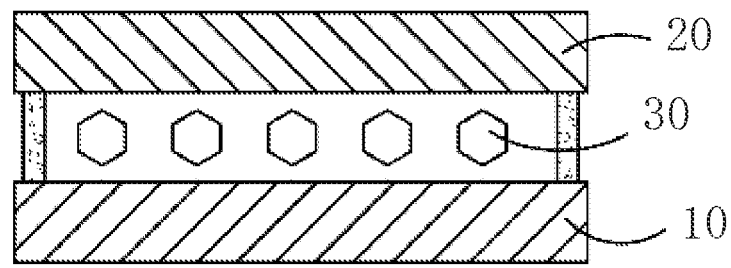
FIG. 1 is a schematic structural diagram of a display panel provided by an embodiment of the present application.

The following will clearly and completely describe the technical solutions in the embodiments of the application with reference to the drawings in the embodiments of the application. Apparently, the described embodiments are only some of the embodiments of the application, not all of them. Based on the embodiments in this application, all other embodiments obtained by those skilled in the art without making creative efforts belong to the scope of protection of this application. In addition, it should be understood that the specific implementations described here are only used to illustrate and explain the present application and are not intended to limit the present application. In this application, unless stated to the contrary, the used orientation words such as "up" and "down" usually refer to up and down in the actual use or working state of the device, specifically the direction of the drawing in the drawings, while the terms "inside" and "outside" refer to the outline of the device.

Embodiments of the present application provide a display panel. Each will be described in detail below. It should be noted that the description sequence of the following embodiments is not intended to limit the preferred sequence of the embodiments.

In one embodiment, please refer to FIG. 1, the embodiment of the present application provides a display panel. The display panel comprises an opposite substrate 20, a liquid crystal layer 30 and an array substrate 10. The liquid crystal layer 30 is disposed between the opposite the substrate 20 and the array substrate 10.

Figure 2:
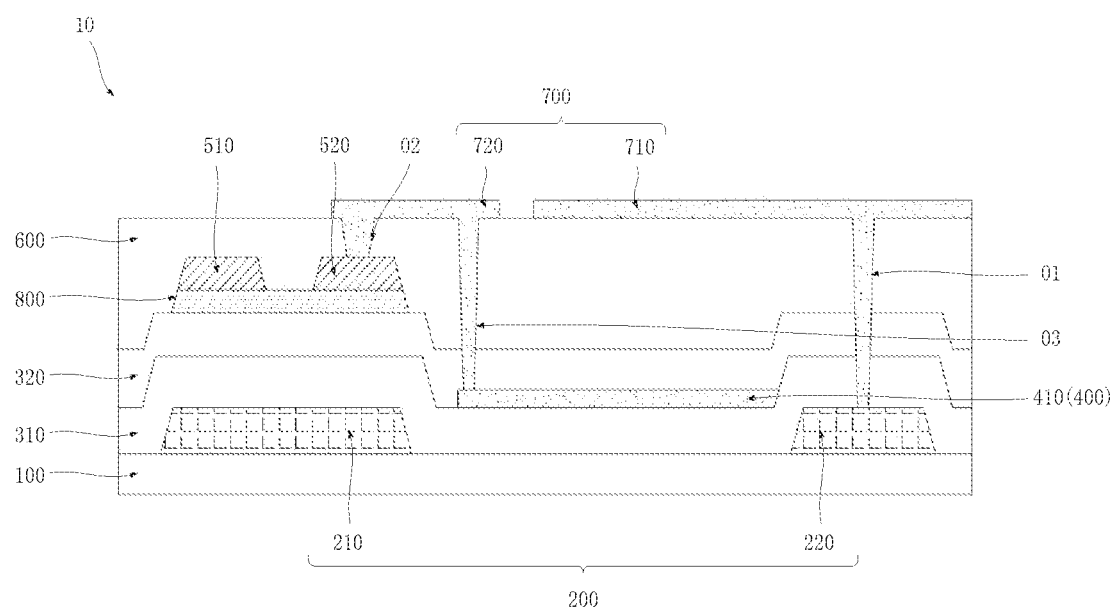
FIG. 2 is a schematic diagram of a first structure of an array substrate provided by the embodiment of the present application.

Please refer to FIG. 1 and FIG. 2, FIG. 2 is a schematic structural diagram of a first structure of an array substrate provided in the embodiment of the present application. In this embodiment, the array substrate 10 comprises a substrate 100 and a first metal layer 200, a first insulating layer 310, a second metal layer 400, a second insulating layer 320, a passivation layer 600 and a third metal layer 700 stacked on the substrate 100. The first insulating layer 310 is disposed on the substrate 100 and the first metal layer 200, and the second metal layer 400 comprises a first electrode 410. The first electrode 410 is one of a pixel electrode and a common electrode, the second insulating layer 320 is disposed on the second metal layer 400 and the first insulating layer 310, the third metal layer 700 comprises a second electrode 710, and the second electrode 710 is the other one of the pixel electrode and the common electrode. Herein, a sum of a thickness of the first insulating layer 310 and a thickness of the second insulating layer 320 is a first predetermined thickness.

It can be understood that, at present, a pixel driving voltage Vop in the array substrate adopting an FFS structure is defined as:

$$Vop = Q \times d / (\varepsilon \times \varepsilon 0 \times S).$$

Herein, Vop is a minimum pixel driving voltage required by a display panel, Q is the capacitive charge between a pixel electrode and a common electrode, S is an area of a single pixel, $\varepsilon 0$ is a vacuum dielectric constant, and $\varepsilon$ is a dielectric constant of an insulating layer between the pixel electrode and the common electrode, and d is a thickness of the insulating layer between the pixel electrode and the common electrode. Obviously, under the predetermined conditions of the single pixel area S and the certain dielectric constant $\varepsilon$, the minimum pixel driving voltage required by the display panel is often affected by the distance between the pixel electrode and the common electrode arranged in different layers. Adjustments of the minimum pixel driving voltage required by the display panel requires adjustments of the thickness of the insulating layer between the pixel electrode and the common electrode. When the thickness d of the insulating layer between the pixel electrode and the common electrode increases, the minimum pixel driving voltage required by the display panel increases. When the thickness d of the insulating layer between the pixel electrode and the common electrode decreases, the minimum pixel driving voltage required by the display panel decreases. However, each film layer and film thickness area in the current array substrate 10 tends to be fixed, and the thickness of the film layer structure such as the gate insulating layer and passivation protection layer is limited by the process yield and reliability. It is impossible to accurately adjust the minimum pixel driving voltage required by the display panel, and the pixel driving voltage actually generated by the display panel needs to be greater than the minimum pixel driving voltage required by the display panel to drive the pixel electrode to generate sufficient electric field forces, so traditional display panels cannot meet the precise adjustment requirements for actual pixel driving voltage and power consumption.

In this embodiment, by disposing the first electrode 410 and the second electrode 710 of the display panel between the first insulating layer 310 and the second insulating layer 320, and making a sum of the thickness of the first insulating layer 310 and the thickness of the second insulating layer 320 is maintained at a first predetermined thickness, which is convenient for adjusting the thickness of the second insulating layer 320 to adjust the distance between the first electrode 410 and the second electrodes 710. On the basis of not affecting an overall thickness and reliability of the first insulating layer 310 and the second insulating layer 320, the minimum pixel driving voltage required by the display panel can be realized, and precise adjustment requirements of the pixel driving voltage and power consumption actually generated by the display panel can be realized.

It should be noted that, in this embodiment, the first electrode 410 and the second electrode 710 may be any combination of a pixel electrode and a common electrode. Specifically, when the first electrode 410 is a pixel electrode, the second electrode 710 is a common electrode. When the first electrode 410 is a common electrode, the second electrode 710 is a pixel electrode. In addition, the array substrate 10 comprises a plurality of thin film transistors, and the thin film transistors may have a top-gate structure or a bottom-gate structure. Specifically, in this embodiment, the technical solution of the present application will be described later by taking the thin-film transistor with a bottom-gate structure as an example.

It can be understood that, when the thin film transistor has a bottom gate structure, the array substrate comprises a gate insulating layer disposed between the active layer 800 and the gate 210, and the gate insulating layer comprises the first insulating layer 310 and the second insulating layer 320. The first predetermined thickness can be selected according to the reliability of the manufacturing process or structure of the array substrate. At this time, the distance between the first electrode 410 and the second electrodes 710 is equal to the sum of the thickness of the first insulating layer 310 and the thickness of the second insulating layer 320. In the process of manufacturing the array substrate 10, based on the design requirements, when a larger pixel driving voltage is needed, the thickness of the second insulating layer 320 can be increased while the thickness of the first insulating layer 310 can be decreased. Obviously, the increased thickness of the second insulating layer 320 is equal to the decreased thickness that of the first insulating layer 310, and vice versa, and will not be repeated here. Therefore, the precise adjustment of the required minimum pixel driving voltage can be realized on the basis of not affecting the overall thickness and reliability of the first insulating layer 310 and the second insulating layer 320, and then the precise adjustment of the pixel driving voltage and power consumption actually generated by the display panel are thereby realized.

It should be noted that the distance between the first electrode 410 and the second electrode 710 is equal to the sum of the thickness of the first insulating layer 310 and the thickness of the second insulating layer 320. The distance between the first electrode 410 and the second electrode 710 is at least greater than the thickness of the passivation layer 600, so that the first electrode 410 and the second electrode 710 have a larger distance, which is suitable for a display panel having pixels with larger driving voltage requirements.

Furthermore, in this embodiment, the second insulating layer 320 and the passivation layer 600 can be made of the same material, so as to ensure the stability of the dielectric constant of the second insulating layer 320 and the passivation layer 600, and also improve the stability of adjusting the pixel driving voltage by adjusting the thickness of the second insulating layer 320. Specifically, the dielectric coefficient of the second insulating layer 320 can be made to be the same as the dielectric coefficient of the passivation layer 600.

It should be noted that the second insulating layer 320 and the passivation layer 600 are made of the same material, so that the refractive index of the second insulating layer 320 and the refractive index of the passivation layer 600 are the same, which can avoid occurring of refraction or reflection between the second insulating layer 320 and the passivation layer 600, thereby reducing losses of light propagating between the second insulating layer 320 and the passivation layer 600.

In this embodiment, the first metal layer 200 comprises a gate 210 and a common signal trace 220. The third metal layer 700 further comprises a bridging component 720, and the bridging component 720 is disposed to be spaced apart from the second electrode 710. The array substrate 10 further comprises an active layer 800, a source 510, a drain 520, a first via hole 01, a second via hole 02, and a third via hole 03. Herein, the first via hole 01 penetrates the passivation layer 600, the second insulating layer 320 and the first insulating layer 310. The second via hole 02 penetrates the passivation layer 600, and the third via hole 03 penetrates the passivation layer 600 and the second insulating layer 320. It should be noted that the active layer 800 is disposed corresponding to the gate 210, and the two ends of the active layer 800 are respectively connected to the source 510 and the drain 520.

It should be noted that, in this embodiment, a technical solution of the present application taking the first electrode 410 as a pixel electrode and the second electrode 710 as a common electrode as an example is disclosed. Specifically, the common electrode is connected to the common signal trace 220 through the first via hole 01, one end of the bridging component 720 is connected to the drain 520 through the second via hole 02, and the other end of the bridging component 720 is connected to the pixel electrode through the third via hole 03.

It can be understood that, the third metal layer 700 comprises the second electrode 710 and the bridging component 720, the second electrode 710 is connected to the common signal trace 220 through the first via hole 01, one end of the bridging component 720 is connected to the drain 520 through the second via hole 02, and the other end of the bridging component 720 is connected to the first electrode 410 through the third via hole 03. Herein, the first via hole 01, the second via hole 02, and the third via hole 03 can be formed in the same process using a half-mask mask to avoid additional process steps. In addition, the second electrode 710 and the bridging component 720 are arranged on the same layer, and the second electrode 710 and the bridging component 720 can be made of the same material, which is convenient to be formed through one process, and additional process steps are avoided on the basis of realizing the precise adjustment of the minimum pixel driving voltage required for the display panel.

Figure 3:
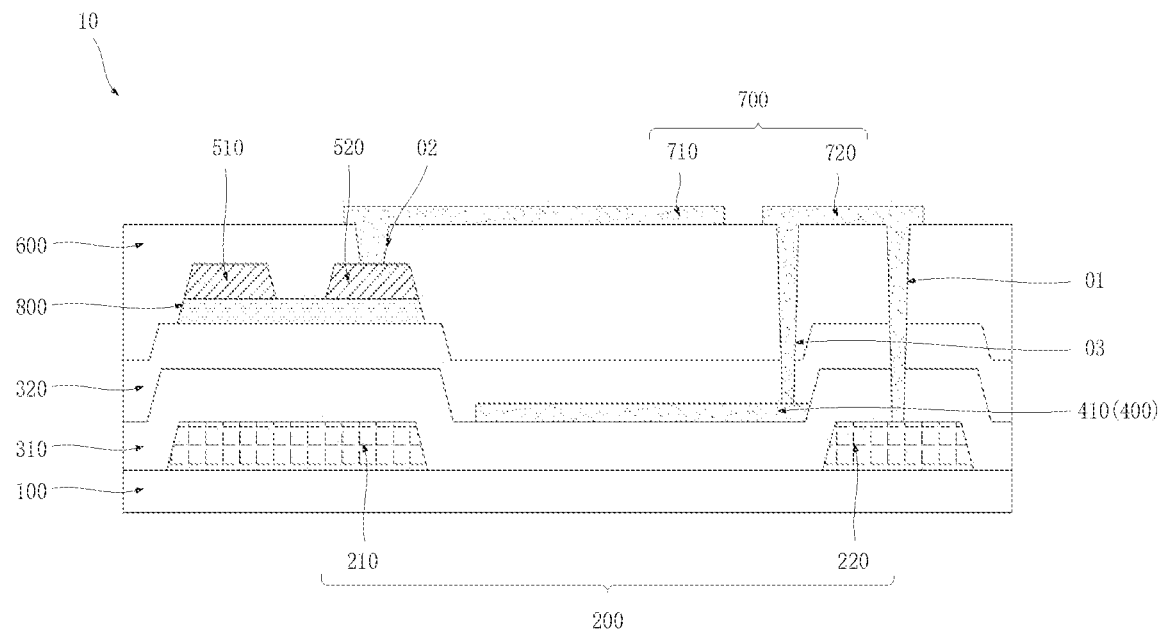
FIG. 3 is a schematic diagram of a second structure of an array substrate provided by the embodiment of the present application.

In one embodiment, please refer to FIG. 1 and FIG. 3. Herein, FIG. 3 is a schematic diagram of a second structure of an array substrate provided by the embodiment of the present application. In this embodiment, the structure of the array substrate is similar or the same as the first structure of the array substrate of the above embodiment. For details, please refer to the description of the array substrate in the above-mentioned embodiments, which will not be repeated here. Only differences between the two embodiments are:

In this embodiment, the first electrode 410 is a common electrode, and the second electrode 710 is a pixel electrode. The pixel electrode is connected to the drain 520 through the second via hole 02, one end of the bridging component 720 is connected to the common signal 220 through the first via hole 01, and the other end of the bridging component 720 is connected to the common electrode through the third via hole 03.

It can be understood that, the third metal layer 700 comprises the second electrode 710 and the bridging component 720, the second electrode 710 is connected to the drain 520 through the second via hole 02, one end of the bridge component 720 is connected to the common signal 220 through the first via hole 01, and the other end of the bridge component 720 is connected to the first electrode 410 through the third via hole 03. Herein, the first via hole 01, the second via hole 02, and the third via hole 03 can be formed in the same process using a half-mask mask to avoid additional process steps. In addition, the second electrode 710 and the bridging component 720 are arranged on the same layer, and the second electrode 710 and the bridging component 720 can be made of the same material, which is convenient to be formed through one process, and additional process steps are avoided on the basis of realizing the precise adjustment of the minimum pixel driving voltage required for the display panel.

In one embodiment, a ratio of the thickness of the first insulating layer 310 to the second insulating layer 320 is 0.1 to 10.

It can be understood that the ratio of the thickness of the first insulating layer 310 to the thickness of the second insulating layer 320 is set to be in the range of 0.1 to 10. That is, the ratio of the thickness of the first insulating layer 310 to the thickness of the second insulating layer 320 can be flexibly adjusted according to the requirements of the pixel driving voltage under the condition that the sum of the thickness of the first insulating layer 310 and the thickness of the second insulating layer 320 of the second insulating layer 320 is under a constant value, thereby ensuring the flexibility of adjusting the ratio between the thickness of the first insulating layer 310 and the thickness of the second insulating layer 320.

Figure 4:
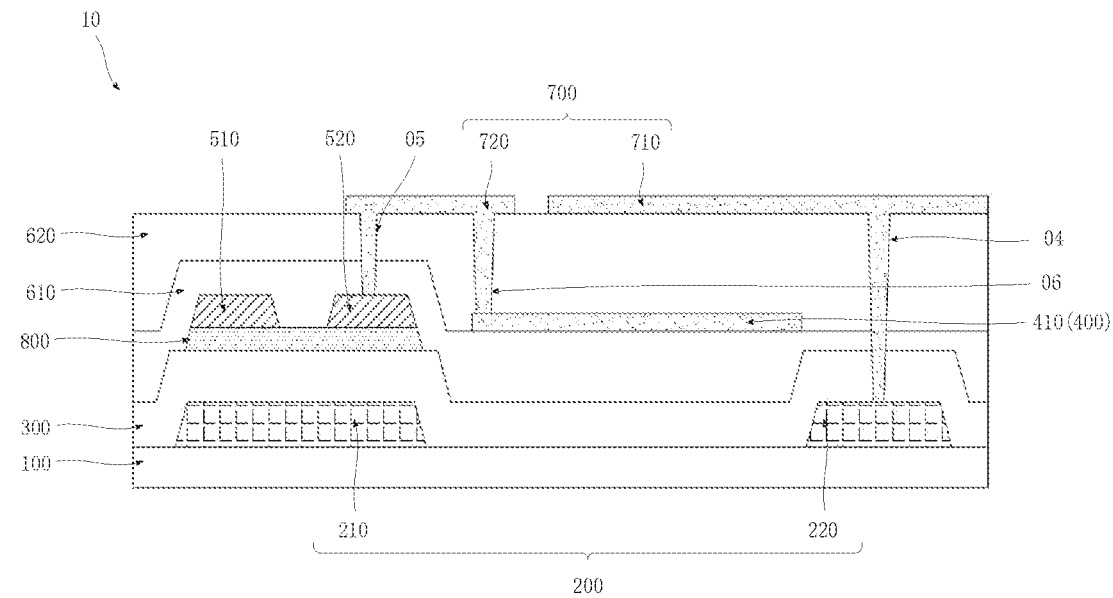
FIG. 4 is a schematic diagram of a third structure of an array substrate provided by the embodiment of the present application.

In another embodiment, please refer to FIG. 1 and FIG. 4. Herein, FIG. 4 is a schematic diagram of a third structure of an array substrate provided by an embodiment of the present application.

An embodiment of the present application provides a display panel, which comprises an opposite substrate 20, a liquid crystal layer 30 and an array substrate 10. The liquid crystal layer 30 is disposed between the opposite substrate 20 and the array substrate 10.

The array substrate 10 comprises a substrate 100, and a first metal layer 200, an insulating layer 300, a first passivation layer 610, a second metal layer 400, a second passivation layer 620 and a third metal layer 700 that are stacked on the substrate 100. Herein, the insulating layer 300 is disposed on the substrate 100 and the first metal layer 200, the first passivation layer 610 is disposed on the insulating layer 300, and the second metal layer 400 comprises a first electrode 410. The first electrode 410 is one of a pixel electrode and a common electrode, and the second passivation layer 620 is disposed on the first passivation layer 610 and the second metal layer 400. The third metal layer 700 comprises a second electrode 710, which is the other one of the pixel electrode or the common electrode. Herein, the sum of the thickness of the first passivation layer 610 and the second passivation layer 620 is a second predetermined thickness.

It should be noted that, in this embodiment, the first electrode 410 and the second electrode 710 may be any combination of a pixel electrode and a common electrode. Specifically, when the first electrode 410 is a pixel electrode, the second electrode 710 is a common electrode. When the first electrode 410 is a common electrode, the second electrode 710 is a pixel electrode. In addition, the array substrate 10 comprises a plurality of thin film transistors, and the thin film transistors may have a top-gate structure or a bottom-gate structure. Specifically, in this embodiment, the technical solution of the present application will be described later by taking the thin-film transistor with a bottom-gate structure as an example.

It can be understood that, when the thin film transistor has a bottom gate structure, the array substrate comprises the first passivation layer 610 and the second passivation layer 620 disposed between the active layer 800 and the third metal layer 700. The second predetermined thickness can be selected according to the reliability of the manufacturing process or structure of the array substrate. At this time, the distance between the first electrode 410 and the second electrode 710 is equal to the thickness of the second passivation layer 620. In the process of manufacturing the array substrate 10, according to design requirements, when a larger pixel driving voltage is required, the thickness of the second passivation layer 620 can be increased, and at the same time the thickness of the first passivation layer 610 can be decreased. Obviously, the increased thickness of the second passivation layer 620 is equal to the decrease thickness of the first passivation layer 610, and vice versa, which will not be repeated here. Therefore, the precise adjustment of the required minimum pixel driving voltage can be realized on the basis of not affecting the overall thickness and reliability of the first passivation layer 610 and the second passivation layer 620, and then the precise adjustment of the pixel driving voltage and power consumption actually generated by the display panel are thereby realized.

It should be noted that the distance between the first electrode 410 and the second electrode 710 is equal to the thickness of the second passivation layer 620, so that the first electrode 410 and the second electrode 710 are directly adjusted according to the thickness of the second passivation layer 620. Obviously, the distance between the first electrode 410 and the second electrode 710 is smaller than the sum of the thickness of the thickness of the first passivation layer 610 and the thickness of the second passivation layer 620, which is suitable for a display panel that requires a relatively small pixel driving voltage.

As described the above, in this embodiment, the dielectric coefficient of the second passivation layer 620 is greater than 1.8. It can be understood that the distance between the first electrode 410 and the second electrode 710 is equal to the second thickness of the passivation layer 620. That is, there is only one layer of the second passivation layer 620 between the first electrode 410 and the second electrode 710, the dielectric coefficient of the second passivation layer 620 is set to be greater than 1.8, so that the second passivation layer 620 has better breakdown resistance, reducing the breakdown probability of the second passivation layer 620 due to a relatively large voltage between the first electrode 410 and the second electrode 710. Specifically, the material of the second passivation layer 620 may be one of silicon nitride or silicon oxide, and the dielectric coefficient of the second passivation layer 620 is 1.8-2.

In this embodiment, the first metal layer 200 comprises a gate 210 and a common signal trace 220. The third metal layer 700 further comprises a bridging component 720, and the bridging component 720 is disposed to be spaced apart from the second electrode 710. The array substrate 10 further comprises an active layer 800, a source electrode 510, a drain electrode 520, a fourth via hole 04, a fifth via hole 05, and a sixth via hole 06. Herein, the fourth via hole 04 penetrates the second passivation layer 620, the first passivation layer 610 and the insulating layer 300. The fifth via hole 05 penetrates the second passivation layer 620 and the first passivation layer 610. The sixth via hole 06 penetrates the second passivation layer 620. It should be noted that the active layer 800 is disposed corresponding to the gate 210, and the two ends of the active layer 800 are respectively connected to the source 510 and the drain 520.

It should be noted that, in this embodiment, the technical solution of the present application is described by taking the first electrode 410 as a pixel electrode and the second electrode 710 as a common electrode as an example. Specifically, the common electrode is connected to the common signal trace 220 through fourth via hole 04, one end of the bridging component 720 is connected to the drain 520 through the fifth via hole 05, and the other end of the bridging component 720 is connected to the pixel electrode through the sixth via hole 06.

It can be understood that the third metal layer 700 comprises the second electrode 710 and the bridging component 720, and the second electrode 710 is connected to the common signal trace 220 through the fourth via hole 04. One end of the bridging component 720 is connected to the drain 520 through the fifth via hole 05, and the other end of the bridging component 720 is connected to the first electrode 410 through the sixth via hole 06. Herein, the fourth via hole 04, the fifth via hole 05, and the sixth via hole 06 can be formed in the same process using a half-mask mask to avoid additional process steps. In addition, the second electrode 710 and the bridging component 720 are arranged on the same layer, and the second electrode 710 and the bridging component 720 can be made of the same material, which is convenient to be formed through one process, and additional process steps are avoided on the basis of realizing the precise adjustment of the minimum pixel driving voltage required for the display panel.

Figure 5:
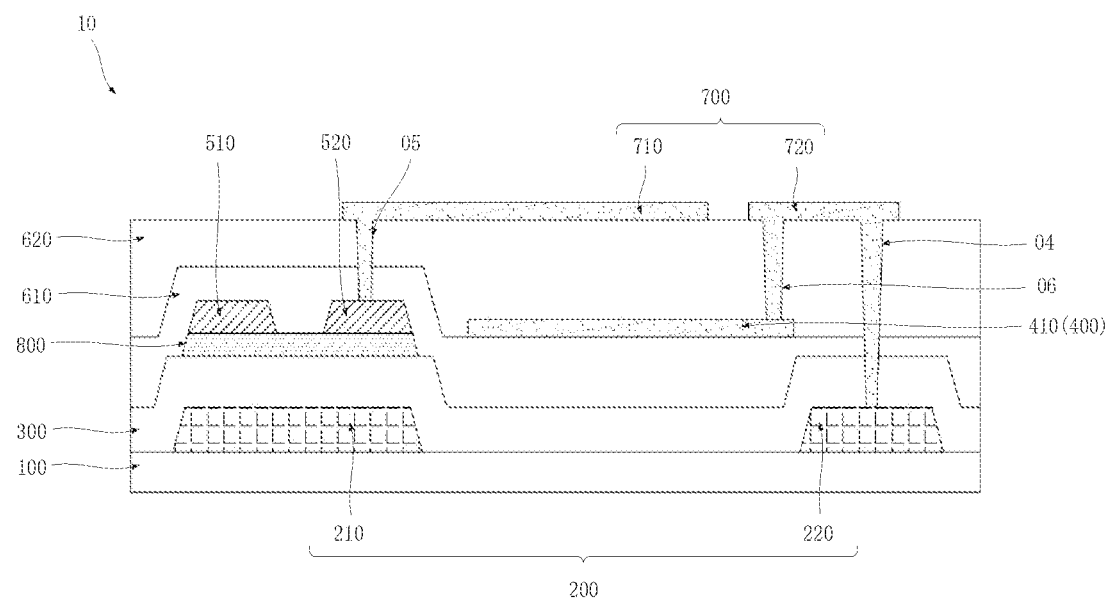
FIG. 5 is a schematic diagram of a fourth structure of an array substrate provided by the embodiment of the present application.

In one embodiment, please refer to FIG. 1 and FIG. 5. Herein, FIG. 5 is a schematic diagram of a fourth structure of an array substrate provided by an embodiment of the present application. In this embodiment, the structure of the array substrate is similar with or the same as that of the third structure of the array substrate provided in above embodiment. For details, please refer to the description of the array substrate in the above-mentioned embodiments and will not be repeated here. Only differences between the two embodiments are described below.

In this embodiment, the first electrode 410 is a common electrode, and the second electrode 710 is a pixel electrode. The pixel electrode is connected to the drain 520 through the fifth via hole 05, and one end of the bridging component 720 is connected to the common signal trace 220 through the fourth via hole 04, and the other end of the bridging component 720 is connected to the common electrode through the sixth via hole 06.

It can be understood that the third metal layer 700 comprises the second electrode 710 and the bridging component 720. The second electrode 710 is connected to the drain 520 through the fifth via hole 05, one end of the bridging component 720 is connected to the common signal line 220 through the fourth via hole 04, and the other end of the bridging component 720 is connected to the first electrode 410 through the sixth via hole 06. Herein, the fourth via hole 04, the fifth via hole 05, and the sixth via hole 06 can be formed in the same process using a half-mask mask to avoid additional process steps. In addition, the second electrode 710 and the bridging component 720 are arranged on the same layer, and the second electrode 710 and the bridging component 720 can be made of the same material, which is convenient to be formed through one process, and additional process steps are avoided on the basis of realizing the precise adjustment of the minimum pixel driving voltage required for the display panel.

The embodiments of the present application have been introduced in detail. In this paper, specific examples have been used to illustrate the principle and implementation of the present application. The description of the above embodiment is only used to help understand the method and core idea of the present application. Meanwhile, for those skilled in the art, based on the idea of this application, there will be changes in the specific implementation and scope of application. In summary, the content of this specification should not be construed as limiting the application.

What is claimed is:

1. A display panel, comprising:
   an opposing substrate, a liquid crystal layer, and an array substrate, wherein the liquid crystal layer is disposed between the opposing substrate and the array substrate; and
   wherein the array substrate comprises:
   a substrate;
   a first metal layer disposed on the substrate;
   a first insulating layer disposed on the substrate and the first metal layer;
   a second metal layer disposed on the first insulating layer, the second metal layer comprises a first electrode, and the first electrode is one of a pixel electrode and a common electrode;
   a second insulating layer disposed on the second metal layer and the first insulating layer;
   a passivation layer disposed on the second insulating layer; and
   a third metal layer disposed on the passivation layer, the third metal layer comprises a second electrode, and the second electrode is the other one of the pixel electrode and the common electrode;

wherein a sum of a thickness of the first insulating layer and a thickness of the second insulating layer is a first predetermined thickness;

wherein the first metal layer comprises a gate and a common signal trace;

the third metal layer further comprises a bridging component; and the array substrate further comprises:

a source;

a drain;

a first via hole, wherein the first via hole penetrates the passivation layer, the second insulating layer and the first insulating layer;

a second via hole, wherein the second via hole penetrates the passivation layer; and a third via hole, wherein the third via hole penetrates the passivation layer and the second insulating layer;

wherein the first electrode is the pixel electrode, and the second electrode is the common electrode; and the common electrode is connected to the common signal line through the first via hole, one end of the bridge component is connected to the drain through the second via hole, and the other end of the bridge component is connected to the pixel electrode through the third via hole.

2. The display panel according to claim 1, wherein a ratio of the thickness of the first insulating layer to the thickness of the second insulating layer is in the range of 0.1 to 10.

3. A display panel, comprising:

an opposing substrate, a liquid crystal layer, and an array substrate, wherein the liquid crystal layer is disposed between the opposing substrate and the array substrate; and wherein the array substrate comprises:

a substrate;

a first metal layer disposed on the substrate;

a first insulating layer disposed on the substrate and the first metal layer;

a second metal layer disposed on the first insulating layer, the second metal layer comprises a first electrode, and the first electrode is one of a pixel electrode and a common electrode;

a second insulating layer disposed on the second metal layer and the first insulating layer;

a passivation layer disposed on the second insulating layer; and a third metal layer disposed on the passivation layer, the third metal layer comprises a second electrode, and the second electrode is the other one of the pixel electrode and the common electrode;

wherein a sum of a thickness of the first insulating layer and a thickness of the second insulating layer is a first predetermined thickness;

wherein the first metal layer comprises a gate and a common signal trace;

the third metal layer further comprises a bridging component; and the array substrate further comprises:

a source;

a drain;

a first via hole, wherein the first via hole penetrates the passivation layer, the second insulating layer and the first insulating layer;

a second via hole, wherein the second via hole penetrates the passivation layer; and a third via hole, wherein the third via hole penetrates the passivation layer and the second insulating layer;

wherein the first electrode is a common electrode, and the second electrode is a pixel electrode; and the pixel electrode is connected to the drain through the second via hole, one end of the bridging component is connected to the common signal trace through the first via hole, and the other end of the bridging component is connected to the common electrode through the third via hole.

4. A display panel, comprising:

an opposing substrate, a liquid crystal layer, and an array substrate, wherein the liquid crystal layer is disposed between the opposing substrate and the array substrate; and wherein the array substrate comprises:

a substrate;

a first metal layer disposed on the substrate;

an insulating layer disposed on the substrate and the first metal layer;

a first passivation layer disposed on the insulating layer;

a second metal layer disposed on the first passivation layer, the second metal layer comprises a first electrode, and the first electrode is one of a pixel electrode and a common electrode;

a second passivation layer disposed on the first passivation layer and the second metal layer;

a third metal layer disposed on the second passivation layer, wherein the third metal layer comprises a second electrode, and the second electrode is the other one of the pixel electrode and the common electrode;

wherein a sum of a thickness of the first passivation layer and a thickness of the second passivation layer is a second predetermined thickness;

wherein the first metal layer comprises gates and common signal traces;

the third metal layer further comprises a bridging component; and the array substrate further comprises:

a source;

a drain;

a fourth via hole, wherein the fourth via hole penetrates the second passivation layer, the first passivation layer, and the insulating layer;

a fifth via hole, wherein the fifth via hole penetrates the second passivation layer and the first passivation layer; and a six via hole, wherein the six via hole penetrates the second passivation layer.

5. The display panel according to claim 4, wherein the first electrode is a pixel electrode, and the second electrode is a common electrode; and the common electrode is connected to the common signal trace through the fourth via hole, one end of the bridge component is connected to the drain through the fifth via hole, and the other end of the bridge component is connected to the pixel electrode through the sixth via hole.

6. The display panel according to claim 4, wherein the first electrode is a common electrode, and the second electrode is a pixel electrode; and the pixel electrode is connected to the drain through the fifth via hole, one end of the bridge component is connected to the common signal trace through the fourth via hole, and the other end of the bridge component is connected to the common signal line through the sixth via hole.

7. The display panel according to claim 4, wherein a ratio of a thickness of the first passivation layer to a thickness of the second passivation layer is in the range of 0.1 to 10.

8. The display panel according to claim 4, wherein a dielectric constant of the second passivation layer is greater than 1.8.

* * * * *